(12) United States Patent
Aida et al.

(10) Patent No.: US 9,065,032 B2
(45) Date of Patent: Jun. 23, 2015

(54) METHOD FOR MANUFACTURING LIGHT-EMITTING ELEMENT, AND LIGHT-EMITTING ELEMENT

(75) Inventors: Hideo Aida, Tokyo (JP); Natsuko Aota, Tokyo (JP); Hidetoshi Takeda, Tokyo (JP); Keiji Honjo, Tokyo (JP); Hitoshi Hoshino, Tokyo (JP)

(73) Assignees: NAMIKI SEIMITSU HOUSEKI KABUSHIKIKAISHA (JP); DISCO CORPORATION (JP)

( * ) Notice: Subject to any disclaimer, the term of this patent is extended or adjusted under 35 U.S.C. 154(b) by 0 days.

(21) Appl. No.: 14/119,694

(22) PCT Filed: Apr. 3, 2012

(86) PCT No.: PCT/JP2012/059067
§ 371 (c)(1),
(2), (4) Date: Feb. 14, 2014

(87) PCT Pub. No.: WO2012/160880
PCT Pub. Date: Nov. 29, 2012

(65) Prior Publication Data
US 2014/0217458 A1 Aug. 7, 2014

(30) Foreign Application Priority Data

May 23, 2011 (JP) ................... 2011-114636

(51) Int. Cl.
*H01L 21/00* (2006.01)
*H01L 33/62* (2010.01)
(Continued)

(52) U.S. Cl.
CPC ............ *H01L 33/62* (2013.01); *H01L 33/0079* (2013.01); *H01L 33/0095* (2013.01);
(Continued)

(58) Field of Classification Search
CPC .................................................. H01L 33/382

USPC .................... 257/13, 98; 438/22, 46
See application file for complete search history.

(56) References Cited

U.S. PATENT DOCUMENTS 6,657,237 B2 * 12/2003 Kwak et al. ................ 257/99
7,745,240 B2 6/2010 Furuya
(Continued)

FOREIGN PATENT DOCUMENTS

EP 1460694 A1 9/2004
JP 8-83929 A 3/1996
(Continued)

OTHER PUBLICATIONS

Extended European Search Report for Application No./Patent No. 12789367.5-1551/2717335 PCT/JP2012059067, dated Nov. 5, 2014, with English translation.
(Continued)

*Primary Examiner* — David Vu
(74) *Attorney, Agent, or Firm* — Cantor Colburn LLP

(57) ABSTRACT

Provided are a method of manufacturing a light-emitting element by which a light-emitting element (80) is manufactured through the following steps and a light-emitting element manufactured by employing the method. A light-emitting element layer (40) is formed on one face (32T) of a monocrystalline substrate (30A) for a light-emitting element. Next, the other face (32B) of the monocrystalline substrate (30A) for a light-emitting element is polished until a state where a vertical hole (34A) penetrates the monocrystalline substrate (30A) for a light-emitting element in its thickness direction is established. Next, a conductive material is filled into the vertical hole (34B) from the side of the vertical hole (34B) closer to an opening (36B) in the other face (32B) to form a conductive portion (50) that is continuous from a side closer to the light-emitting element layer (40) to the opening (36B) in the other face (32B).

7 Claims, 7 Drawing Sheets

(51) Int. Cl.
  *H01L 33/00* (2010.01)
  *H01L 33/38* (2010.01)
(52) U.S. Cl.
  CPC ....... *H01L33/387* (2013.01); *H01L 2933/0016* (2013.01); *H01L 33/382* (2013.01); *H01L 2924/0002* (2013.01)

(56) References Cited

U.S. PATENT DOCUMENTS

| | | |
|---|---|---|
| 2007/0069222 A1 | 3/2007 | Ko et al. |
| 2007/0173068 A1 | 7/2007 | Negley |
| 2007/0200116 A1 | 8/2007 | Harris et al. |
| 2008/0026497 A1 | 1/2008 | Furuya |

FOREIGN PATENT DOCUMENTS

| | | |
|---|---|---|
| JP | 10-84167 A | 3/1998 |
| JP | 10-173235 A | 6/1998 |
| JP | 10-308640 A | 11/1998 |
| JP | 11-45892 A | 2/1999 |
| JP | 2002210730 A | 7/2002 |
| JP | 2004-104100 A | 4/2004 |
| JP | 2004272014 A | 9/2004 |
| JP | 2004-288839 A | 10/2004 |
| JP | 2005074663 A | 3/2005 |
| JP | 2007-73734 A | 3/2007 |
| JP | 2008021887 A | 1/2008 |
| KR | 20080076308 A | 8/2008 |
| WO | 2007089077 A1 | 8/2007 |

OTHER PUBLICATIONS

International Search Report for International Application No. PCT/JP2012-059067, mailed May 15, 2012, with English translation.

Japanese Notice of Reasons for Rejection corresponding to Application No. JP2013-516243; Date of Mailing: Apr. 7, 2015, with English translation.

* cited by examiner

METHOD FOR MANUFACTURING LIGHT-EMITTING ELEMENT, AND LIGHT-EMITTING ELEMENT

CROSS REFERENCE TO RELATED APPLICATIONS

This is the U.S. national stage of application No. PCT/JP2012/059067, filed on 3 Apr. 2012. Priority under 35 U.S.C. §119(a) and 35 U.S.C. §365(b) is claimed from Japanese Application No. 2011-114636, filed 23 May 2011, the disclosure of which is also incorporated herein by reference.

TECHNICAL FIELD

The present invention relates to a method of manufacturing a light-emitting element and a light-emitting element.

BACKGROUND ART

As a light-emitting element, there has been widely known an element that includes, on a monocrystalline substrate such as a sapphire substrate, a layer having a function as a light-emitting element in which one or more semiconductor layers and the like have been laminated (light-emitting element layer). In the light-emitting element having such layer construction, a pair of electrodes is formed by providing in order of: a first electrode; a light-emitting element layer; an insulating monocrystalline substrate; and a second electrode in the thickness direction of the element.

Available as a method of manufacturing a light emitting diode (LED), which being one kind of light-emitting element, is a laser lift-off technology involving: forming the LED as a light-emitting element layer on a sapphire substrate; and then peeling the sapphire substrate with a laser. The employment of the laser lift-off technology enables the formation of a vertical LED that allows a large current to flow. However, the technology has been poor in yield because the sapphire substrate is hard to be completely peeled with the laser, and damage to the LED may also be caused by the laser.

In view of the foregoing, for electrically connecting the light-emitting element layer and the second electrode, there has been disclosed a manufacturing method involving: forming a vertical hole across the monocrystalline substrate so as to penetrate the monocrystalline substrate in its thickness direction, and filling a conductive material into the vertical hole; or forming the material into a layer shape in the hole, to thereby secure conduction between the light-emitting element layer and the second electrode (see Patent Literatures 1 to 4). In addition, when a buffer layer is further formed between the light-emitting element layer and the monocrystalline substrate, a vertical hole that penetrates the thickness directions of the monocrystalline substrate and the buffer layer is formed, and then the conductive material is filled into the vertical hole (see Patent Literatures 1, 3, and 4). The employment of such manufacturing method leads to an improvement in yield because the method eliminates the need for completely peeling the monocrystalline substrate from the light-emitting element layer.

In each of the technologies described in Patent Literatures 1 to 4, the vertical hole is formed by utilizing any one of various etching methods such as dry etching and laser ablation after forming at least part of the respective layers forming the buffer layer and light-emitting element layer to be formed on the monocrystalline substrate.

CITATION LIST

Patent Literature

[PTL 1] JP 8-83929 A
[PTL 2] JP 10-173235 A
[PTL 3] JP 10-84167 A
[PTL 4] JP 11-45892 A

SUMMARY OF INVENTION

Technical Problem

However, in the case where a light-emitting element is manufactured by utilizing any one of the processes exemplified in Patent Literatures 1 to 4, a light-emitting element layer may be damaged when an etching amount at the time of the formation of a vertical hole becomes more excessive. In this case, the light-emitting characteristics and the like of the light-emitting element are adversely affected. On the other hand, when the etching amount is insufficient in order that excessive etching may be avoided, a conduction path between the light-emitting element layer and an electrode (second electrode) to be formed on a side opposite to the side of a monocrystalline substrate on which the light-emitting element layer is formed cannot be secured. That is, in this case, the light-emitting element itself cannot be manufactured.

The present invention has been made in view of the circumstances, and an object of the present invention is to provide a method of manufacturing a light-emitting element, by which damage to a light-emitting element layer, caused by the formation of a vertical hole to be formed in a monocrystalline substrate when manufacturing the light-emitting element can be eliminated to zero, and a light-emitting element manufactured by the method of manufacturing a light-emitting element.

Solution to Problem

The above-mentioned object is achieved by the present invention described below.

Specifically, a method of manufacturing a light-emitting element according to a first embodiment of the present invention includes at least: a light-emitting element layer-forming step of forming a light-emitting element layer on one face of a monocrystalline substrate for a light-emitting element provided with a vertical hole having an opening only in the one face; a polishing step of polishing another face of the monocrystalline substrate for a light-emitting element until a state where the vertical hole penetrates the monocrystalline substrate for a light-emitting element in a thickness direction thereof is established after performing at least the light-emitting element layer-forming step; and a conductive portion-forming step of filling a conductive material into the vertical hole from a side of the vertical hole closer to an opening in the another face after performing at least the polishing step to form a conductive portion that is continuous from a side closer to the light-emitting element layer to the opening in the another face.

A method of manufacturing a light-emitting element according to a second embodiment of the present invention by using a filmed monocrystalline substrate for a light-emitting element, which includes a monocrystalline substrate for a light-emitting element provided with a vertical hole having an opening only in one face thereof, and a film formed on the one face of the monocrystalline substrate for a light-emitting element and formed of one or more layers including at least a layer formed of a GaN-based material, the method including at least: a polishing step of polishing another face of the monocrystalline substrate for a light-emitting element until a state where the vertical hole penetrates the monocrystalline substrate for a light-emitting element in a thickness direction thereof is established; and a conductive portion-forming step of filling a conductive material into the vertical hole from a side of the vertical hole closer to an opening in the another face after performing at least the polishing step to form a conductive portion that is continuous from a side closer to the film to the opening in the another face.

In one embodiment mode of each of the method of manufacturing a light-emitting element according to the first embodiment of the present invention and the method of manufacturing a light-emitting element according to the second embodiment of the present invention, it is preferred that the monocrystalline substrate for a light-emitting element is formed at least through: an altered layer-forming step of irradiating a monocrystalline substrate with a laser from a side closer to one face of the monocrystalline substrate while focusing the laser in a vicinity of a surface of the one face to form an altered layer of a substantially columnar shape whose center line in an axial direction intersects the one face; and a vertical hole-forming step of bringing at least the one face into contact with an etching solution after performing at least the altered layer-forming step to selectively dissolve and remove the altered layer to form a vertical hole having an opening only in the one face.

In another embodiment mode of each of the method of manufacturing a light-emitting element according to the first embodiment of the present invention and the method of manufacturing a light-emitting element according to the second embodiment of the present invention, it is preferred that the irradiation with the laser is performed to satisfy irradiation conditions described in one selected from the following A and B.
<Irradiation Conditions A>
Laser wavelength: 200 nm to 350 nm
Pulse width: Nanosecond order
<Irradiation Conditions B>
Laser wavelength: 350 nm to 2,000 nm
Pulse width: Femtosecond order to picosecond order In still another embodiment mode of each of the method of manufacturing a light-emitting element according to the first embodiment of the present invention and the method of manufacturing a light-emitting element according to the second embodiment of the present invention, it is preferred that: an inner wall surface of the vertical hole is formed of an etching surface; and an inner diameter of the vertical hole with respect to a depth direction of the vertical hole reduces in a substantially linear function manner from a side closer to the opening in the one face to a side closer to the opening in the another face.

A light-emitting element according to the first embodiment of the present invention is manufactured at least through: a light-emitting element layer-forming step of forming a light-emitting element layer on one face of a monocrystalline substrate for a light-emitting element provided with a vertical hole having an opening only in the one face; a polishing step of polishing another face of the monocrystalline substrate for a light-emitting element until a state where the vertical hole penetrates the monocrystalline substrate for a light-emitting element in a thickness direction thereof is established after performing at least the light-emitting element layer-forming step; and a conductive portion-forming step of filling a conductive material into the vertical hole from a side of the vertical hole closer to an opening in the another face after performing at least the polishing step to form a conductive portion that is continuous from a side closer to the light-emitting element layer to the opening in the another face.

A light-emitting element according to the second embodiment of the present invention is manufactured by subjecting a filmed monocrystalline substrate for a light-emitting element, which includes a monocrystalline substrate for a light-emitting element provided with a vertical hole having an opening only in one face thereof, and a film formed on the one face of the monocrystalline substrate for a light-emitting element and formed of one or more layers including at least a layer formed of a GaN-based material, to at least: a polishing step of polishing another face of the monocrystalline substrate for a light-emitting element until a state where the vertical hole penetrates the monocrystalline substrate for a light-emitting element in a thickness direction thereof is established; and a conductive portion-forming step of filling a conductive material into the vertical hole from a side of the vertical hole closer to an opening in the another face after performing at least the polishing step to form a conductive portion that is continuous from a side closer to the film to the opening in the another face.

In one embodiment mode of each of the light-emitting element according to the first embodiment of the present invention and the light-emitting element according to the second embodiment of the present invention, it is preferred that the monocrystalline substrate for a light-emitting element is formed at least through: an altered layer-forming step of irradiating a monocrystalline substrate with a laser from a side closer to one face of the monocrystalline substrate while focusing the laser in a vicinity of a surface of the one face to form an altered layer of a substantially columnar shape whose center line in an axial direction intersects the one face; and a vertical hole-forming step of bringing at least the one face into contact with an etching solution after performing at least the altered layer-forming step to selectively dissolve and remove the altered layer to form a vertical hole having an opening only in the one face.

A light-emitting element according to a third embodiment of the present invention includes: a monocrystalline substrate for a light-emitting element having a vertical hole that penetrates from one face thereof to another face thereof and whose openings in both the faces are of substantially circular shapes; a light-emitting element layer formed on the one face; a first electrode formed on a face of the light-emitting element layer on a side opposite to a side on which the monocrystalline substrate for a light-emitting element is provided; a second electrode formed on the another face; and a conductive portion that is formed of a conductive material filled into the vertical hole, and electrically connects the second electrode and the light-emitting element layer, in which: an inner wall surface of the vertical hole is formed of an etching surface; and an inner diameter of the vertical hole with respect to a depth direction of the vertical hole reduces in a substantially linear function manner from a side closer to the opening in the one face to a side closer to the opening in the another face.

According to the present invention, it is possible to provide the method of manufacturing a light-emitting element by which damage to the light-emitting element layer caused by the formation of the vertical hole to be formed in the monocrystalline substrate when manufacturing the light-emitting element can be eliminated to zero, and the light-emitting element manufactured by the method of manufacturing a light-emitting element.

DESCRIPTION OF EMBODIMENTS

A method of manufacturing a light-emitting element according to a first embodiment of the present invention includes at least: a light-emitting element layer-forming step of forming a light-emitting element layer on one face of a monocrystalline substrate for a light-emitting element provided with a vertical hole having an opening only in the one face; a polishing step of polishing another face of the monocrystalline substrate for a light-emitting element until a state where the vertical hole penetrates the monocrystalline substrate for a light-emitting element in a thickness direction thereof is established after performing at least the light-emitting element layer-forming step; and a conductive portion-forming step of filling a conductive material into the vertical hole from a side of the vertical hole closer to an opening in the another face after performing at least the polishing step to form a conductive portion that is continuous from a side closer to the light-emitting element layer to the opening in the another face.

Figure 1:
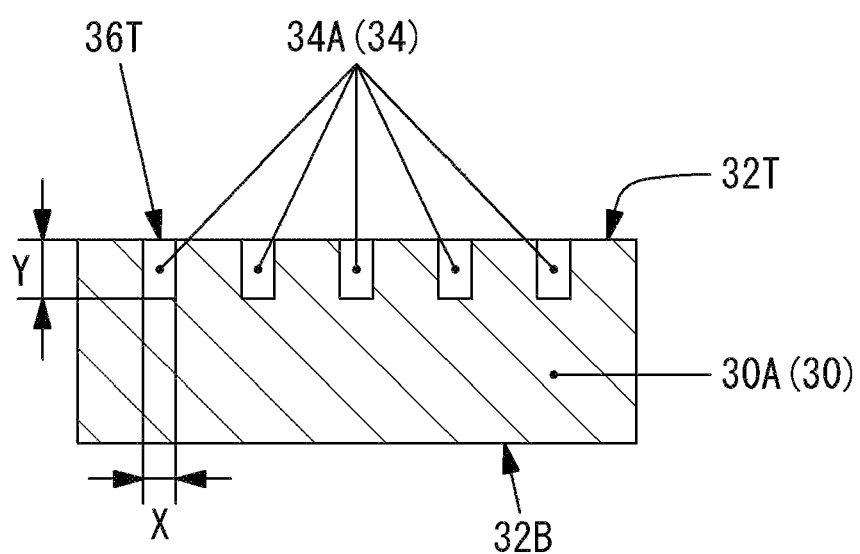
FIG. 1 is a schematic sectional view illustrating an example of a monocrystalline substrate for a light-emitting element to be used in the manufacture of a light-emitting element according to a first embodiment of the present invention.

Here, the monocrystalline substrate for a light-emitting element to be used in the manufacture of the light-emitting element is provided with vertical holes having openings only in one of its faces. FIG. 1 is a schematic sectional view illustrating an example of the monocrystalline substrate for a light-emitting element to be used in the manufacture of the light-emitting element of the first embodiment.

A monocrystalline substrate 30A (30) for a light-emitting element illustrated in FIG. 1 is provided with vertical holes 34A (34) having openings 36T in one face (first face 32T).

Here, the number of the vertical holes 34A, their placement positions in the first face 32T, and the like can be appropriately selected. In addition, the shape of each of the openings 36T of the vertical holes 34A can be appropriately selected from, for example, a circular shape, an elliptical shape, and a belt shape. It should be noted that the following description is made on the premise that the shapes of the openings 36T are substantially circular. Here, a depth Y of each of the vertical holes 34A can be appropriately selected. However, the depth Y is preferably as large as possible from the viewpoint of reducing a polishing amount to the extent possible in a polishing step (so-called backlap treatment) of polishing the other face (second face 32B) of the monocrystalline substrate 30A for a light-emitting element. In this case, the depth Y preferably falls within the range of about 30 µm to 100 µm in consideration of an etching depth that can be realized easily by various vertical hole-forming methods to be described later. In addition, an inner diameter X in each of the openings 36T of the vertical holes 34A, which is not particularly limited, is preferably 10 µm or less, preferably 5 µm or less. When the inner diameter X in each of the openings of the vertical holes 34A is set to 5 µm or less, the utilization of an epitaxial lateral overgrowth (ELOG) method in the formation of the light-emitting element layer on the first face 32T when manufacturing the light-emitting element enables the formation of the light-emitting element layer without embedding a material forming the light-emitting element layer in the vertical holes 34A. Although a lower limit for the inner diameter X is not particularly limited, the inner diameter X is preferably 2 µm or more so that a conductive material such as a metal can be certainly filled into the vertical holes 34A when manufacturing the light-emitting element. Although a ratio (Y/X) of the depth Y to the inner diameter X is not particularly limited, the ratio is set to preferably 3 or more, more preferably 8 or more. In this case, the vertical holes 34A that are vertically long can be formed.

A known etching method can be appropriately utilized as a method of forming the vertical holes 34A and an example thereof is the following etching method. First, an etching-resistant film is formed on one surface of the monocrystalline substrate and then the openings are formed by subjecting the etching-resistant film to patterning. After that, the surface of the monocrystalline substrate exposed in the openings are etched by the dry etching or wet etching. Thus, the vertical holes 34A can be formed.

Although the method described above requires a mask (etching-resistant film provided with openings) for limiting a region to be etched, the vertical holes 34A can be formed by a mask-less process when laser irradiation is utilized. For example, the vertical holes 34A can be formed by irradiating a partial region of the surface of the monocrystalline substrate with a laser to evaporate a material forming the monocrystalline substrate. In this case, the dry etching or the wet etching may be performed as required after the laser treatment. Alternatively, the vertical holes 34A can be formed by forming altered layers in a partial region of the surface of the monocrystalline substrate through the laser irradiation and then selectively removing the altered layers through the wet etching or the dry etching. It should be noted that out of the various methods of forming the vertical holes 34A described above, the method involving forming the altered layers through the laser irradiation and then performing the wet etching is preferred from the following viewpoint: the vertical holes 34A can be efficiently formed within a short time period.

Figure 2:
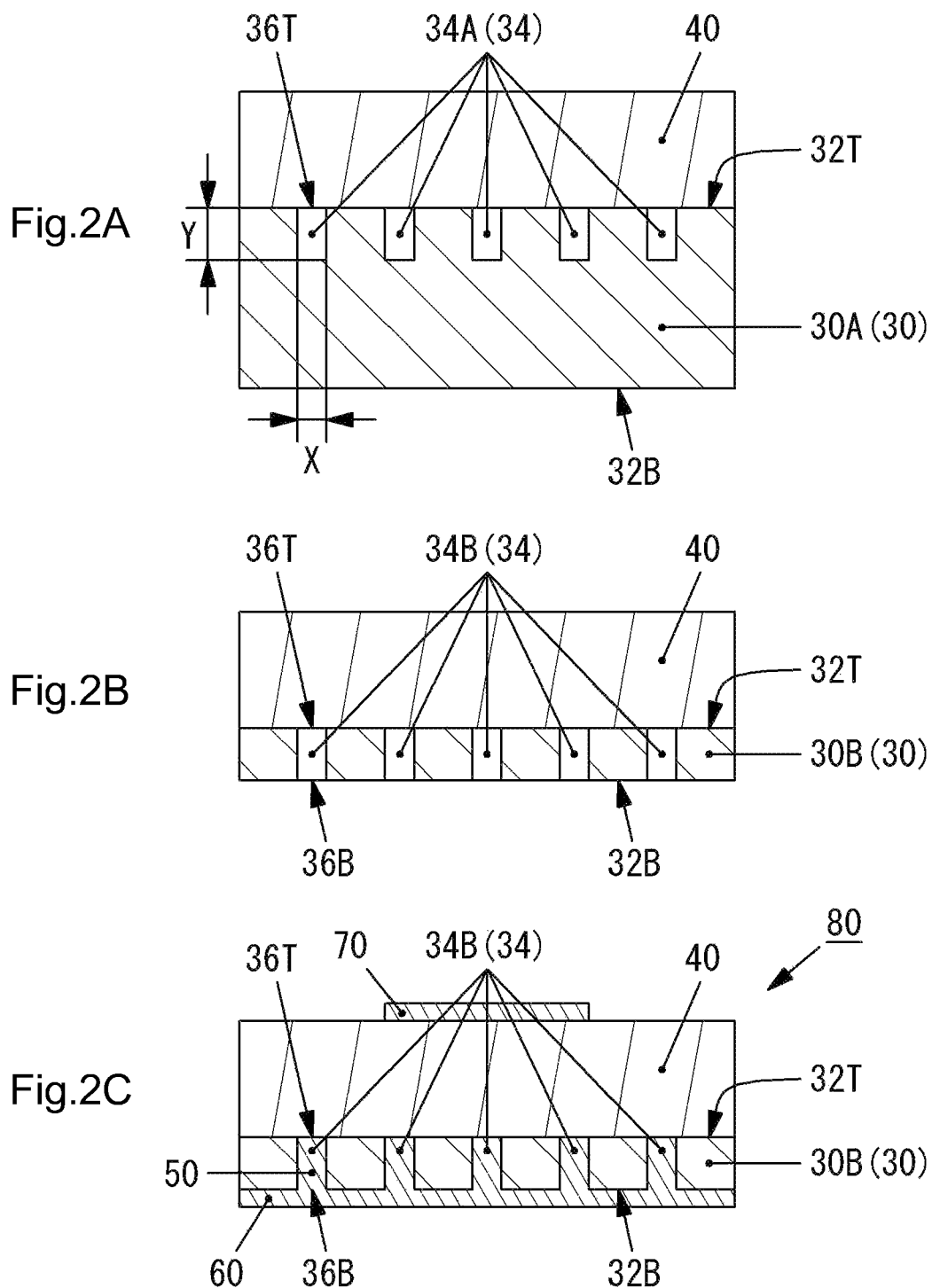
FIGS. 2A, 2B and 2C are schematic sectional views illustrating an example of a method of manufacturing the light-emitting element of the first embodiment, FIG. 2(A) being a view illustrating a light-emitting element layer-forming step, FIG. 2(B) being a view illustrating a polishing step, and FIG. 2(C) being a view illustrating a conductive portion-forming step.

Next, the light-emitting element layer-forming step, the polishing step, and the conductive portion-forming step are described. FIG. 2 are schematic sectional views illustrating an example of the method of manufacturing a light-emitting element of the first embodiment. Here, FIG. 2(A) is a view illustrating the light-emitting element layer-forming step, FIG. 2(B) is a view illustrating the polishing step (backlap treatment), and FIG. 2(C) is a view illustrating the conductive portion-forming step.

First, in the light-emitting element layer-forming step, as illustrated in FIG. 2(A), a light-emitting element layer 40 is formed on one face (first face 32T) of the monocrystalline substrate 30A for a light-emitting element. It should be noted that in the light-emitting element layer-forming step, a buffer layer may be formed on the first face 32T as required before the formation of the light-emitting element layer 40. In the example illustrated in FIG. 2(A), the openings 36T are of substantially circular shapes and their inner diameters are set to sizes suitable for film formation by the ELOG method, specifically, about 2 μm to 5 μm. In addition, the light-emitting element layer 40 is formed by utilizing the ELOG method. Accordingly, in the example illustrated in FIG. 2(A), a material forming the light-emitting element layer 40 is substantially absent in the vertical holes 34A.

Here, a known layer construction of a light-emitting element can be appropriately selected for the light-emitting element layer 40 as long as the layer includes at least one semiconductor layer formed of gallium nitride or the like and has a function of emitting light upon electrification. That is, the layer construction of the light-emitting element layer 40, and the thickness, material, and crystallinity/amorphous property of each layer forming the light-emitting element layer 40 are appropriately selected in accordance with, for example, light-emitting characteristics which the light-emitting element is required to have and a manufacturing process for the light-emitting element.

However, at least one of the layers forming the light-emitting element layer 40 is preferably a crystalline layer. In addition, at least a layer in direct contact with the first face 32T of the monocrystalline substrate 30A for a light-emitting element out of the respective layers forming the light-emitting element layer 40 is preferably a crystalline layer from the following viewpoint, and all layers forming the light-emitting element layer 40 may be crystalline layers: epitaxial growth can be performed by utilizing a crystal face exposed to the first face 32T of the monocrystalline substrate 30A for a light-emitting element. It should be noted that the term "epitaxial growth" comprehends homoepitaxial growth and heteroepitaxial growth including the same composition or a mixed crystal. In addition, materials for the respective layers forming the light-emitting element layer 40 are appropriately selected in accordance with the element to be formed. However, in consideration of the case where the monocrystalline substrate 30A for a light-emitting element is formed of a monocrystalline material such as sapphire, the materials forming the respective layers are preferably inorganic materials such as a metal material, a metal oxide material, and an inorganic semiconductor material, and all layers are desirably formed of these inorganic materials; provided that when a metal organic chemical vapor deposition (MOCVD) method is employed as a film-forming method, the inorganic material of each layer may contain organic matter derived from an organic metal in itself.

Specific examples of the respective layers forming the light-emitting element layer 40 can include GaN—, AlGaN—, and InGaN-based nitride semiconductor crystal layers suitable for the manufacture of various elements utilizing nitride semiconductors such as a light-emitting element to be used in a surface-emitting laser or the like, a light-receiving element to be used in an optical sensor, solar cell, or the like, and a semiconductor element to be used in an electronic circuit or the like. For example, when a light-emitting element utilizing a nitride semiconductor is formed, first, a buffer layer formed of GaN is formed on the first face 32T of the monocrystalline substrate 30A for a light-emitting element. After that, the light-emitting element layer 40 formed of the following layer construction can be formed: an n-type contact layer formed of n-type GaN, an n-type clad layer formed of n-type AlGaN, an active layer formed of n-type InGaN, a p-type clad layer formed of p-type AlGaN, and a p-type contact layer formed of p-type GaN are laminated in the stated order on the buffer layer.

Methods of forming the light-emitting element layer 40 and the buffer layer to be formed as required are not particularly limited, and known film-forming methods can be utilized. In addition, the respective layers can be formed by adopting film-forming methods and/or film-forming conditions different from layer to layer. Although a liquid phase film-forming method such as a plating method is given as a film-forming method, a vapor phase film-forming method such as a sputtering method or a chemical vapor deposition (CVD) method is preferably employed. It should be noted that when a semiconductor crystal layer such as a nitride semiconductor crystal layer is formed for the purpose of forming a light-emitting element or the like, a vapor phase film-forming method such as the MOCVD method, a hydride vapor phase epitaxy (HYPE) method, or a molecular beam epitaxy (MBE) method is more preferably utilized. It should be noted that the first face 32T of the monocrystalline substrate 30A for a light-emitting element is particularly preferably in a mirror surface state (having a surface roughness Ra of about 1 nm or less). The first face 32T of the monocrystalline substrate 30A for a light-emitting element can be subjected to mirror polishing for bringing the first face 32T into the mirror surface state. Alternatively, the following process may be adopted: after the face of a monocrystalline substrate to be used in the formation of the monocrystalline substrate 30A for a light-emitting element in which the vertical holes 34A are to be formed has been subjected to mirror polishing, the monocrystalline substrate 30A for a light-emitting element is formed by using the monocrystalline substrate. The first face 32T of the monocrystalline substrate 30A for a light-emitting element formed through such process is also in the mirror surface state.

After at least the light-emitting element layer-forming step illustrated in FIG. 2(A) has been performed, the polishing step (so-called backlap treatment) of polishing the other face (second face 32B) of the monocrystalline substrate 30A for a light-emitting element until a state where the vertical holes 34A penetrate the monocrystalline substrate 30A for a light-emitting element in its thickness direction is established is performed (FIG. 2(B)). Then, at the stage of the completion of the backlap treatment, through-holes (vertical holes 34B (34)) having openings 36B in the second face 32B as well are formed. It should be noted that during the backlap treatment, the second face 32B is polished in a state where the surface of the light-emitting element layer 40 illustrated in FIG. 2(A) is fixed by being attached to a flat substrate. It should be noted that the thickness of a monocrystalline substrate 30B (30) for a light-emitting element after the backlap treatment can be set within the range of about 30 μm to 100 μm, though the thickness depends on the depth Y of each of the vertical holes 34A before the backlap treatment.

On the other hand, in a conventional method of manufacturing a light-emitting element exemplified in any one of, for example, Patent Literatures 1 to 4, the method involving forming the vertical holes after at least part of the light-emitting element layer and the buffer layer to be formed as required have been formed, when an etching amount at the time of the formation of the vertical holes becomes excessive, these layers may be damaged and the light-emitting characteristics of the light-emitting element may be adversely affected. In addition, when the etching amount at the time of the formation of the vertical holes becomes insufficient, conduction with an electrode to be formed on a side opposite to the light-emitting element layer across the monocrystalline substrate cannot be secured. Therefore, the etching amount needs to be controlled in an extremely accurate manner upon formation of the vertical holes. In addition, in order that the controllability of the etching amount may be improved, an etching rate cannot be made very large. In the method of manufacturing a light-emitting element of the first embodiment, however, there is no need to take such problems as described above into consideration because the light-emitting element layer 40 is formed on the monocrystalline substrate 30A for a light-emitting element in a state where the vertical holes 34A have already been formed.

Next, after at least the polishing step has been performed, the conductive portion-forming step of filling a conductive material into the vertical holes 34B from the sides of the vertical holes 34B closer to the openings 36B newly formed in the other face (second face 32B) to form conductive portions 50 that are continuous from a side closer to the light-emitting element layer 40 to the openings 36B in the other face (second face 32B) is performed (FIG. 2(C)). In this case, an electrode 60 covering the surface of the second face 32B is typically formed in addition to the formation of the conductive portions 50. Materials forming the conductive portions 50 and the electrode 60 are, for example, a metal material formed of Al, Ti, Cr, Ni, Au, or an alloy thereof, and a conductive polysilicon to which a dopant such as phosphorus has been added. Here, when the metal material is used, a vacuum deposition method or the like can be utilized as a film-forming method, and when the conductive polysilicon is used, the CVD method or the like can be utilized.

In addition, after the light-emitting element layer 40 has been formed, a thin film-shaped electrode 70 is typically formed on the face of the light-emitting element layer 40 on the side opposite to the side on which the monocrystalline substrate 30B for a light-emitting element is formed at an arbitrary timing in the same manner as in the electrode 60. It should be noted that upon formation of the electrodes 60 and 70, the electrodes 60 and 70 may be formed only in predetermined regions of the face of the light-emitting element layer 40 and the second face 32B by patterning. Thus, a light-emitting element 80 illustrated in FIG. 2(C) can be obtained. Here, any other layer formed of a conductive material may be formed between the light-emitting element layer 40 and the electrode 70 as required. In addition, the light-emitting element 80 is cut into chips because the light-emitting element 80 is typically of a wafer shape from which a plurality of chips can be collected.

The light-emitting element 80 of the first embodiment formed through the process illustrated in FIG. 2 described above has such a structure as described below. That is, as illustrated in FIG. 2(C), the light-emitting element 80 includes: the monocrystalline substrate 30B for a light-emitting element having the vertical holes 34B that penetrate from one face (first face 32T) to the other face (second face 32B), and whose openings 36T and 36B in both the faces are of substantially circular shapes; the light-emitting element layer 40 formed on one face (first face 32T) of the monocrystalline substrate 30B for a light-emitting element; the electrode 70 (first electrode) formed on the face of the light-emitting element layer 40 on the side opposite to the side on which the monocrystalline substrate 30B for a light-emitting element is provided; the electrode 60 (second electrode) formed on the other face (second face 32B) of the monocrystalline substrate 30B for a light-emitting element; and the conductive portions 50 that are formed of the conductive material filled into the vertical holes 34B, and electrically connect the electrode 60 and the light-emitting element layer 40.

Although a material forming the monocrystalline substrate 30A for a light-emitting element to be used in the manufacture of the light-emitting element 80 is not particularly limited as long as the material is a monocrystalline material such as sapphire, the material is particularly preferably sapphire in ordinary cases.

Next, a method of manufacturing a light-emitting element according to a second embodiment of the present invention is described. The method of manufacturing a light-emitting element according to the second embodiment of the present invention uses a filmed monocrystalline substrate for a light-emitting element, which includes a monocrystalline substrate for a light-emitting element provided with a vertical hole having an opening only in one face thereof, and a film formed on the one face of the monocrystalline substrate for a light-emitting element and formed of one or more layers including at least a layer formed of a GaN-based material. Then, the light-emitting element is manufactured at least through: a polishing step of polishing another face of the monocrystalline substrate for a light-emitting element (that forms the filmed monocrystalline substrate for a light-emitting element) until a state where the vertical hole penetrates the monocrystalline substrate for a light-emitting element in a thickness direction thereof is established; and a conductive portion-forming step of filling a conductive material into the vertical hole from a side of the vertical hole closer to an opening in the another face after performing at least the polishing step to form a conductive portion that is continuous from a side closer to the film to the opening in the another face.

Figure 3:
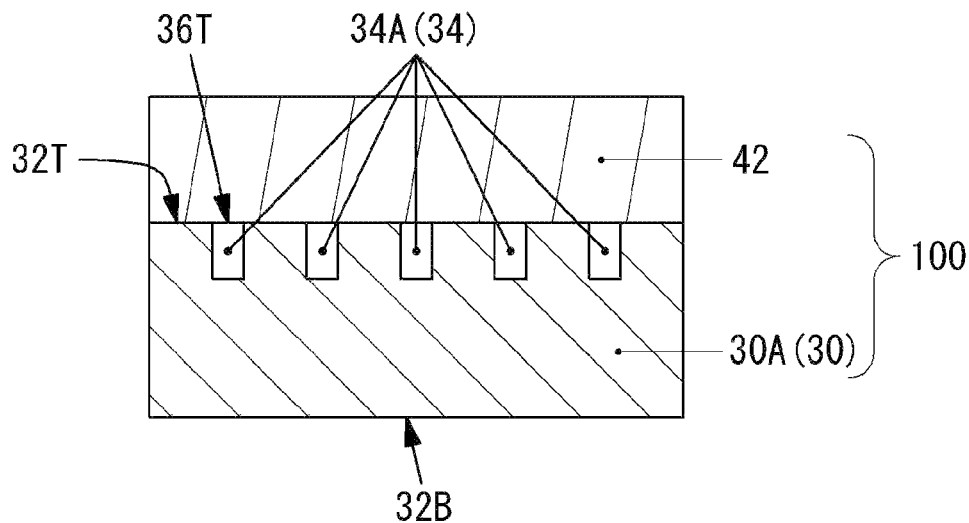
FIG. 3 is a schematic sectional view illustrating an example of a filmed monocrystalline substrate for a light-emitting element to be used in a method of manufacturing a light-emitting element of a second embodiment.

FIG. 3 is a schematic sectional view illustrating an example of a filmed monocrystalline substrate for a light-emitting element to be used in the method of manufacturing a light-emitting element of the second embodiment. A filmed monocrystalline substrate 100 for a light-emitting element illustrated in FIG. 3 is obtained by forming the first face 32T of the monocrystalline substrate 30A for a light-emitting element illustrated in FIG. 1 with a film 42 formed of one or more layers including at least a layer formed of a GaN-based material. That is, the film 42 may be any one of a multilayer film and a monolayer film as long as the film includes the layer formed of the GaN-based material. Here, the film 42 is formed on the first face 32T of the monocrystalline substrate 30A for a light-emitting element by a known film-forming method. In addition, the film 42 has at least one layer out of the respective layers forming the light-emitting element layer 40 including the layer formed of the GaN-based material. That is, the film 42 may be a film that includes all layers forming the light-emitting element layer 40 and has a function as the light-emitting element layer 40, or may be a film that includes only part of the layers forming the light-emitting element layer 40 and does not have a function as the light-emitting element layer 40. It should be noted that when the film 42 is a film that does not have a function as the light-emitting element layer 40, the light-emitting element layer 40 is completed by further laminating a needed layer on the film 42 at an arbitrary timing before the initiation of the polishing step or after the polishing step. Accordingly, unlike a conventional method of manufacturing a light-emitting element, the method of manufacturing a light-emitting element of the second embodiment eliminates the possibility that the layer formed on the first face 32T of the monocrystalline substrate 30A for a light-emitting element is damaged when an etching amount at the time of the formation of the vertical holes becomes excessive.

It should be noted that the polishing step and conductive portion-forming step in the method of manufacturing a light-emitting element of the second embodiment are substantially identical to those of the method of manufacturing a light-emitting element of the first embodiment illustrated in FIG. 2 except that the filmed monocrystalline substrate 100 for a light-emitting element illustrated in FIG. 3 is used instead of the substrate obtained by forming the light-emitting element layer 40 on the first face 32T of the monocrystalline substrate 30A for a light-emitting element illustrated in FIG. 2(A) as the substrate to be used in the polishing step.

The vertical holes 34A to be formed in the monocrystalline substrate 30A for a light-emitting element to be used in the method of manufacturing a light-emitting element of the first embodiment and the monocrystalline substrate 30A for a light-emitting element forming the filmed monocrystalline substrate 100 for a light-emitting element to be used in the method of manufacturing a light-emitting element of the second embodiment described above can be formed by appropriately utilizing various etching methods as described in the foregoing. However, the vertical holes 34A are particularly preferably formed by utilizing the formation of altered layers through laser irradiation and the wet etching of the altered layers.

In this case, the monocrystalline substrate 30A for a light-emitting element can be manufactured at least through: an altered layer-forming step of irradiating a monocrystalline substrate with a laser from a side closer to one face of the monocrystalline substrate while focusing the laser in the vicinity of the surface of the one face to form altered layers of substantially columnar shapes whose center lines in axial directions intersect the one face; and a vertical hole-forming step of bringing at least one face into contact with an etching solution after performing at least the altered layer-forming step to selectively dissolve and remove the altered layers to form vertical holes having openings in the at least one face. Here, a sapphire substrate is particularly preferably used as the monocrystalline substrate to be used in the manufacture of the monocrystalline substrate 30A for a light-emitting element in ordinary cases, though a known monocrystalline substrate can be used.

In the manufacturing method, the altered layers of substantially columnar shapes whose center lines in axial directions intersect the one face of the monocrystalline substrate are formed through the laser irradiation upon formation of the vertical holes 34A. Such laser irradiation treatment can reduce the amount of energy to be input per unit time and unit area by the laser irradiation as compared to that of a laser irradiation treatment intended for hole formation by the evaporation (ablation) of a material forming the monocrystalline substrate. Accordingly, a time period required for the laser irradiation treatment can be significantly shortened with ease.

Here, the etching rate of each of the altered layers with respect to the etching solution is extremely large as compared with that of a matrix around the altered layers. Although details about the reason for the foregoing are unknown, the reason is assumed as follows: the matrix irradiated with the laser has been reduced in crystallinity (made amorphous) by the laser irradiation. Accordingly, through the utilization of the large difference between the etching rate of each of the altered layers and the etching rate of the matrix around the altered layers described above, substantially only the altered layers are selectively dissolved and removed even when the altered layers and the matrix around the altered layers are simultaneously brought into contact with the etching solution. Accordingly, in the method of manufacturing the monocrystalline substrate 30A for a light-emitting element described above, the vertical holes 34A can be formed without the use of any etching-resistant mask unlike a general technology involving forming the surface of the monocrystalline substrate with an etching-resistant mask and forming the vertical holes 34A through wet etching or dry etching. That is, a mask-less process can be realized upon formation of the vertical holes 34A. Accordingly, the method involving forming the above-mentioned altered layers and then subjecting the altered layers to the wet etching eliminates the need for performing various steps to be performed before and after the dry etching or the wet etching, i.e., the step of forming an etching-resistant film, the step of subjecting the etching-resistant film to patterning, the step of removing the etching-resistant mask after an etching treatment, and other steps such as a washing step to be performed concomitantly with these steps.

Meanwhile, the wet etching can obtain a high etching rate easier than the dry etching generally through the adjustment of, for example, the composition and liquid temperature of the etching solution. However, the monocrystalline substrate, in particular, the monocrystalline substrate formed of a sapphire material is a material that is hardly etched by each of the dry etching and the wet etching. Accordingly, even in a general technology involving forming the vertical holes 34A through the wet etching, the formation of the vertical holes 34A requires some degree of time. However, in the method involving forming the altered layers and then subjecting the altered layers to the wet etching, the vertical holes 34A are not formed by subjecting the very monocrystalline material such as a sapphire material to the wet etching but the vertical holes are formed by subjecting a material that is easily subjected to the wet etching (material forming the altered layers), the material being obtained by altering the monocrystalline material through the laser irradiation, to the wet etching. Accordingly, the method of manufacturing a monocrystalline substrate for a light-emitting element of this embodiment can significantly shorten a time period required for the wet etching as well.

As described above, in the method involving forming the altered layers and then subjecting the altered layers to the wet etching, the two steps, i.e., the altered layer-forming step involving utilizing the laser irradiation and the vertical hole-forming step involving utilizing the wet etching need to be performed upon formation of the vertical holes 34A, but each of the steps can be performed within an extremely short time period. Accordingly, in the method involving forming the altered layers and then subjecting the altered layers to the wet etching, the vertical holes 34A can be formed within a shorter time period than that of any one of the following etching processes: laser etching, the wet etching, the dry etching, and integral etching in which two kinds of etching methods exemplified in Patent Literatures 2, 4, and the like are combined. That is, the productivity of the vertical hole formation is extremely high.

In addition, the wet etching in the method involving forming the altered layers and then subjecting the altered layers to the wet etching is different from typical isotropic wet etching, and is anisotropic wet etching by which substantially only the altered layers are selectively dissolved and removed. Accordingly, the method involving forming the altered layers and then subjecting the altered layers to the wet etching enables shape control comparable to that of the dry etching that enables etching having anisotropy, or the laser etching involving utilizing ablation, upon formation of the vertical holes 34A.

In addition, in the case of the wet etching, the liquid temperature of the etching solution is preferably set within the range of about 200° C. to 300° C.

In addition, the altered layers that may serve as the vertical holes 34A are formed by the laser irradiation. In addition, the laser irradiation intended for the formation of the altered layers can be performed on a plurality of positions of the surface of the monocrystalline substrate within an extremely short time period. For example, a time period required for the formation of about 4,050,000 altered layers each having a depth of about 40 μm in the face of a monocrystalline substrate having a diameter of 2 inches is about 5 minutes. Accordingly, in the method involving forming the altered layers and then subjecting the altered layers to the wet etching, the monocrystalline substrate 30A for a light-emitting element having the many vertical holes 34A in its face can be easily manufactured.

Figure 4A:
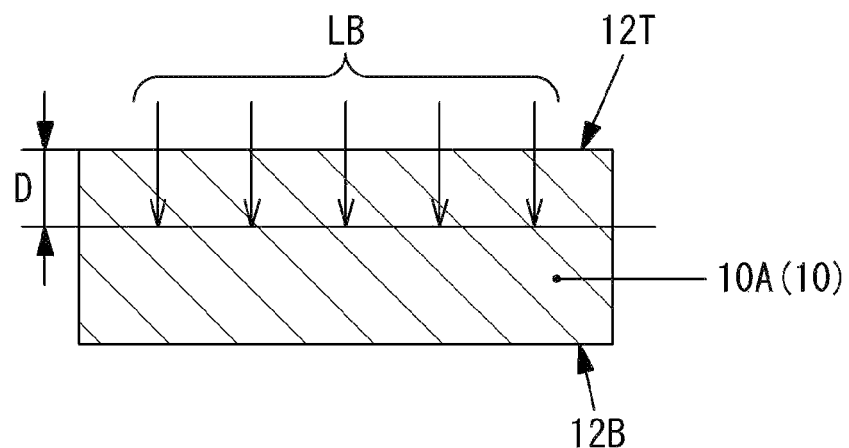
FIGS. 4A and 4B are schematic sectional views illustrating another example of a method of manufacturing a monocrystalline substrate for a light-emitting element, FIG. 4(A) being a sectional view illustrating an example of a monocrystalline substrate during laser irradiation and FIG. 4(B) being a sectional view illustrating an example of the monocrystalline substrate after the completion of the laser irradiation treatment illustrated in FIG. 4(A).

Next, each of the altered layer-forming step and the vertical hole-forming step is described in more detail. First, in the altered layer-forming step, as illustrated in FIG. 4, the altered layers of substantially columnar shapes whose center lines in axial directions intersect one face of the monocrystalline substrate are formed by irradiating the monocrystalline substrate with a laser while focusing the laser in the vicinity of the surface of the one face. FIG. 4 are schematic sectional views illustrating another example of the method of manufacturing the monocrystalline substrate 30A for a light-emitting element, specifically, sectional views illustrating an altered layer-forming step according to an embodiment of the present invention. Here, FIG. 4(A) is a sectional view illustrating an example of the monocrystalline substrate during the laser irradiation and FIG. 4(B) is a sectional view illustrating an example of the monocrystalline substrate after the completion of the laser irradiation treatment illustrated in FIG. 4(A).

Figure 4B:
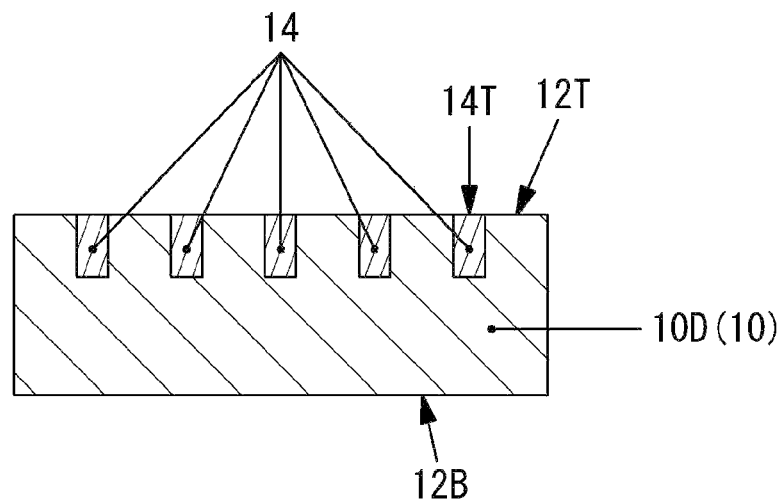

In the embodiment illustrated in FIG. 4, a laser LB is applied from a side closer to a first face 12T. Here, the focal position of the laser LB is fixed in the vicinity of the surface of the first face 12T; specifically, the focal position is fixed at a position having a depth D with reference to the first face 12T (having a depth of zero) with respect to the thickness direction of a monocrystalline substrate 10A. In addition, when the irradiation with the laser LB is continued in this state, altered layers 14 whose center lines A in axial directions intersect the first face 12T are each formed so as to extend from the position having the depth D to the side closer to the first face 12T. Thus, a monocrystalline substrate 10D (10) having formed therein the altered layers 14 illustrated in FIG. 4(B) can be obtained.

Here, the depth and width of each of the altered layers 14 can be controlled by appropriately selecting laser irradiation conditions such as a laser wavelength, laser power, a spot size, and an irradiation time. Although the laser LB is preferably applied from a direction forming an angle of 90° (perpendicular direction) with respect to the first face 12T (or a second face 12B) in ordinary cases, the laser may be applied from a direction forming an angle of less than 90° as required. It should be noted that when the laser LB is applied from the direction perpendicular to the first face 12T, the center lines A in the axial directions of the altered layers 14 are also perpendicular to the first face 12T. In addition, the depth of each of the altered layers 14 is typically set so as to be sufficiently small as compared with the thickness of the monocrystalline substrate 10D. However, the following may be adopted, though whether the following can be adopted depends on the thickness of the monocrystalline substrate 10D and the laser irradiation conditions: the altered layers 14 are formed so as to reach from the side closer to the first face 12T to the second face 12B and the depth of each of the altered layers 14 is made comparable to the thickness of the monocrystalline substrate 10D.

In the example illustrated in FIG. 4, the focal position of the laser LB is fixed at the position having the depth D from the first face 12T during the irradiation with the laser LB. However, the focal position of the laser LB may be moved from the position having the depth D to the side closer to the first face 12T during the irradiation with the laser LB. In addition, the depth D, which can be appropriately selected, is preferably set within the range of 30 μm to 100 μm in ordinary cases. It should be noted that the aspect and conditions of the laser irradiation described above are particularly suitable when the monocrystalline substrate 10 is a sapphire substrate.

With regard to the laser irradiation conditions, the irradiation may be performed under any condition as long as the altered layers 14 each having a desired depth and a desired width can be formed. In general, however, laser irradiation conditions described in the following (1) and (2) under which a pulse laser that intermittently emits laser light is used are preferred because energy can be concentrated in a short time width and hence a high peak output can be obtained.
(1) Laser wavelength: 200 nm to 5,000 nm
(2) Pulse width: Femtosecond order to nanosecond order (1 fs to 1,000 ns)

It should be noted that within the ranges of the irradiation conditions described above, irradiation conditions described in the following A or B are more preferably further selected.
<Irradiation Conditions A>
Laser wavelength: 200 nm to 350 nm
Pulse width: Nanosecond order (1 ns to 1,000 ns). It should be noted that the pulse width more preferably falls within the range of 10 ns to 15 ns.
<Irradiation Conditions B>
Laser wavelength: 350 nm to 2,000 nm
Pulse width: Femtosecond order to picosecond order (1 fs to 1,000 ps). It should be noted that the pulse width more preferably falls within the range of 200 fs to 800 fs.

It should be noted that under the irradiation conditions A, a laser whose wavelength shifts to a shorter wavelength region than that in the case of the irradiation conditions B is utilized. Accordingly, when laser irradiation is performed under the same condition other than the laser wavelength and the pulse width, a laser processing time can be shorter with the irradiation conditions A than with the irradiation conditions B for forming the altered layers 14 each having the depth and the width in the similar level.

In addition, the laser irradiation conditions other than the laser wavelength and the pulse width are preferably selected within the following ranges from the viewpoints of, for example, practicality and mass productivity.
Repetition frequency: 50 kHz to 500 kHz
Laser power: 0.05 W to 0.8 W
Spot size of laser: 0.5 μm to 4.0 μm (more preferably around 2 μm to 3 μm)
Scanning speed of sample stage: 100 mm/s to 1,000 mm/s Subsequently, substantially only the altered layers 14 are selectively dissolved and removed by bringing the monocrystalline substrate 10D having formed therein the altered layers illustrated in FIG. 4(B) into contact with an etching solution. Although wet etching is typically performed by immersing the monocrystalline substrate 10D in the etching solution with which an etching tank is filled, the wet etching may be performed according to, for example, the following aspect: only the side closer to the first face 12T is brought into contact with the etching solution. By the wet etching treatment, there can be obtained the monocrystalline substrate 30A for a light-emitting element having the vertical holes 34A (34) having the openings 36T in the first face 32T as illustrated in FIG. 1. It should be noted that the first face 32T, second face 32B, and vertical holes 34A in the monocrystalline substrate 30A for a light-emitting element correspond to the first face 12T, second face 12B, and altered layers 14 of the monocrystalline substrate 10D illustrated in FIG. 4(B), respectively.

Here, when the monocrystalline substrate 10 is a sapphire substrate, an etching solution containing a phosphate as a main component is used as the etching solution to be used in the vertical hole-forming step. In addition to the phosphate, any other component may be added to the etching solution as required. It should be noted that, for example, acids except phosphate such as sulfuric acid and hydrochloric acid can each be used as the other component for the purpose of, for example, adjusting the pH of the etching solution, or a surfactant such as sodium dodecylbenzenesulfonate can be used as the other component for the purpose of, for example, improving the permeability of the etching solution. Here, the etching solution containing the phosphate as a main component has an ability to gradually erode and dissolve the very sapphire material, but has an ability to significantly erode and dissolve an altered material obtained by altering sapphire through laser irradiation, i.e., the material forming the altered layers 14. Accordingly, substantially only the altered material can be selectively dissolved and removed by utilizing the etching solution. It should be noted that the concentration of each component such as the phosphate in the etching solution and the temperature of the etching solution can be appropriately selected. The liquid temperature of the etching solution is preferably set within the range of about 200° C. to 300° C.

Figure 5:
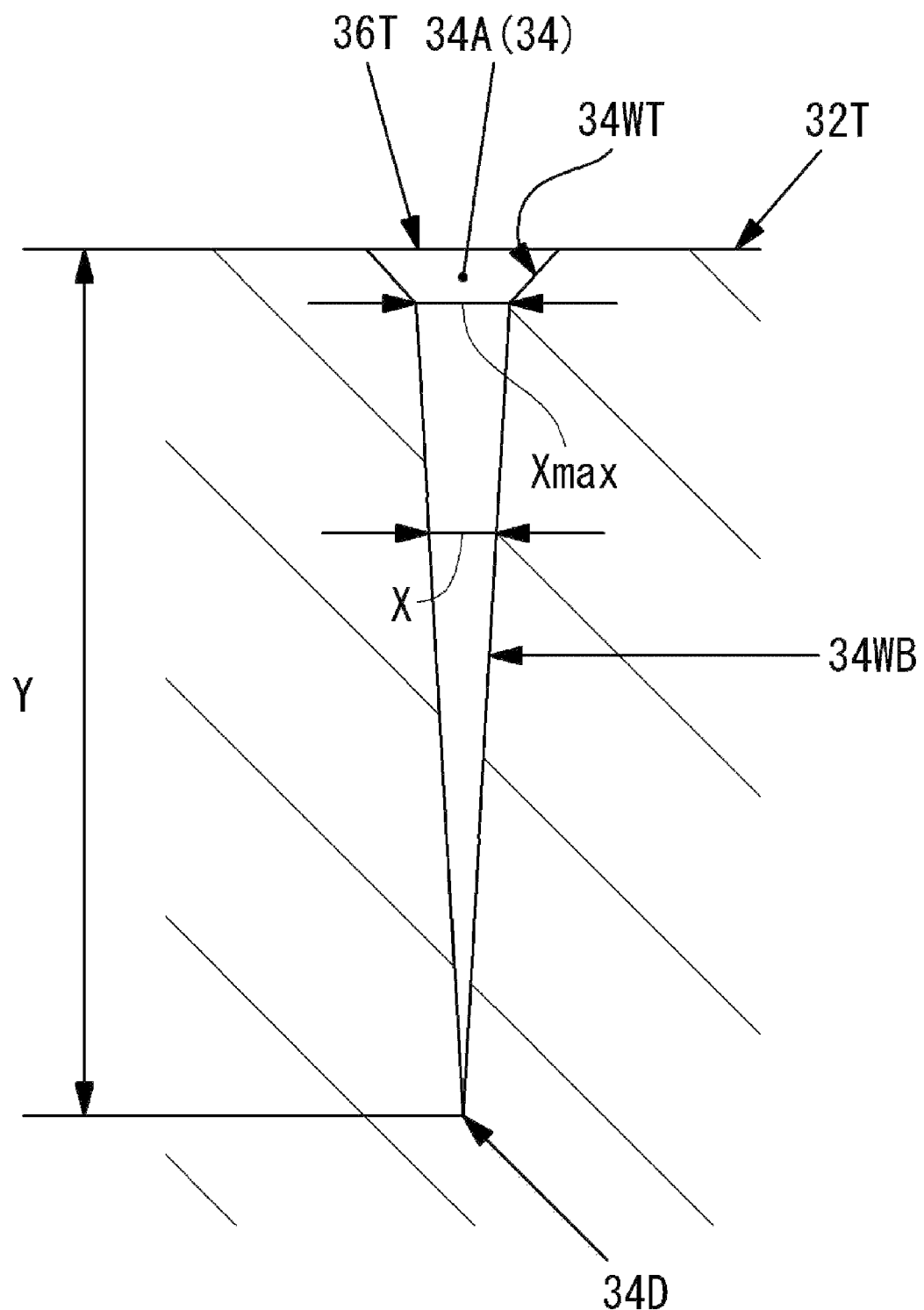
FIG. 5 is a schematic sectional view illustrating an example of a specific sectional shape of a vertical hole.

It should be noted that in the example illustrated in FIG. 1, the vertical holes 34A each having a constant inner diameter with respect to a depth direction are illustrated for description convenience. However, in a process in which the altered layers 14 are subjected to the wet etching to form the vertical holes 34A, the side of the inner wall surface of each of the vertical holes 34A closer to the opening 36T is eroded by the etching solution over a longer time period. Accordingly, in the method involving forming the altered layers 14 and then subjecting the altered layers 14 to the wet etching, the inner diameter X of each of the vertical holes 34A tends to narrow gradually with respect to the depth direction. FIG. 5 is a schematic sectional view illustrating an example of a specific sectional shape of one of the vertical holes 34A illustrated in FIG. 1. That is, the figure illustrates the case where the inner diameter of the vertical hole 34A gradually narrows with respect to the depth direction, in other words, the case where the inner diameter X reduces in substantial proportion to a depth distance when the first face 32T is defined as a depth of zero. Here, in the example illustrated in FIG. 5, the substrate has the vertical hole 34A having the opening 36T only in one face (first face 32T), the opening 36T being of a substantially circular shape, and inner wall surfaces 34WB and 34WT of the vertical hole 34A are each formed of an etching surface formed by the wet etching. In addition, the inner diameter X of the vertical hole 34A with respect to the depth direction of the vertical hole 34A reduces in a substantially linear function manner from a side closer to the opening 36T to a side closer to a bottom portion 34D of the vertical hole 34A. Although details about the reason why the inner diameter reduces in a substantially linear function manner with respect to the depth direction of the vertical hole 34A as described above are unknown, the reason is considered, for example, as follows: the etching solution is always supplied from the side closer to the opening 36T during the wet etching of the altered layers 14. That is, the reduction is considered to be caused by the fact that the retention time of the etching solution with respect to the depth direction of the vertical hole 34A reduces in a substantially linear function manner from the side closer to the opening 36T to the side closer to the bottom portion 34D upon formation of the vertical hole 34A.

It should be noted that in the vertical hole 34A illustrated in FIG. 5, the inner wall surface 34WT of the vertical hole 34A in the vicinity of the opening 36T forms a gently inclined surface forming an angle of, for example, about 30° to 60° with respect to the first face 32T, and the inner wall surface 34WB of the vertical hole 34A on a side closer to the second face 32B (not shown in FIG. 5) with respect to the vicinity of the opening 36T forms a steeply inclined surface forming an angle of, for example, about 80° or more to less than 90° with respect to the first face 32T.

Here, a maximum inner diameter Xmax in the vertical hole 34A having such a sectional shape as illustrated in FIG. 5 means the maximum value of the inner diameter X out of the inner diameters of the inner wall portion of the vertical hole 34A formed to form a steeply inclined surface with respect to the first face 32T. In addition, when the vertical hole 34A has the inner wall surface 34WT formed of the gently inclined surface with respect to the first face 32T in the vicinity of the opening 36T, and the inner wall surface 34WB formed of the steeply inclined surface with respect to the first face 32T on the side closer to the second face 32B with respect to the vicinity of the opening 36T as illustrated in FIG. 5, the substantially linear-function-like reduction of the inner diameter of the vertical hole 34A with respect to the depth direction of the vertical hole 34A has only to occur at least in a region excluding the vicinity of the opening 36T, in other words, the inner wall surface 34WB. Although the sectional shape of the bottom portion 34D of the vertical hole 34A is a conically tapered shape in the example illustrated in FIG. 5, the sectional shape may be a semicircular shape or a trapezoidal shape.

It should be noted that when the wet etching is further performed after the dry etching, the etching solution flows into the vertical hole 34A formed by the dry etching in one stroke. Accordingly, no variation in retention time of the etching solution occurs in the depth direction of the vertical hole 34A unlike the case of the formation of the vertical hole 34A illustrated in FIG. 5. Accordingly, the inner diameter X does not reduce with respect to the depth direction of the vertical hole 34A owing to the variation in retention time of the etching solution with respect to the depth direction of the vertical hole 34A. In the case where the vertical hole 34A is formed by evaporating a sapphire material through laser irradiation as well, the vertical hole 34A similar to that in the case where the dry etching is utilized is formed by virtue of the high directivity of laser light.

Next, a specific manufacturing example of the monocrystalline substrate 30A for a light-emitting element is described.

Manufacturing Example

The monocrystalline substrate 30A for a light-emitting element having the sectional structure illustrated in FIG. 1 was formed according to a procedure to be described later by performing the altered layer-forming step and then performing the vertical hole-forming step in the embodiment illustrated in FIG. 4. First, a circular monocrystalline substrate with an orientation flat surface having a diameter of 2 inches (50.8 mm) and a thickness of 0.43 mm was prepared as the monocrystalline substrate 10A. It should be noted that the first face 12T of the monocrystalline substrate 10A is subjected to mirror polishing in advance so that its surface roughness Ra may be about 1 nm.

Next, the monocrystalline substrate 10A was fixed on a flat sample stage by vacuum adsorption so that the second face 12B was on a lower face side. In this state, the monocrystalline substrate 10A was irradiated with the laser LB from the side closer to the first face 12T. It should be noted that a focal position during the irradiation with the laser LB was set at such a position that the depth D from the surface of the first face 12T became 40 μm, and the substrate was irradiated with the laser LB from a direction perpendicular to the first face 12T. Details about conditions for the irradiation with the laser LB are described below.

Figure 7:
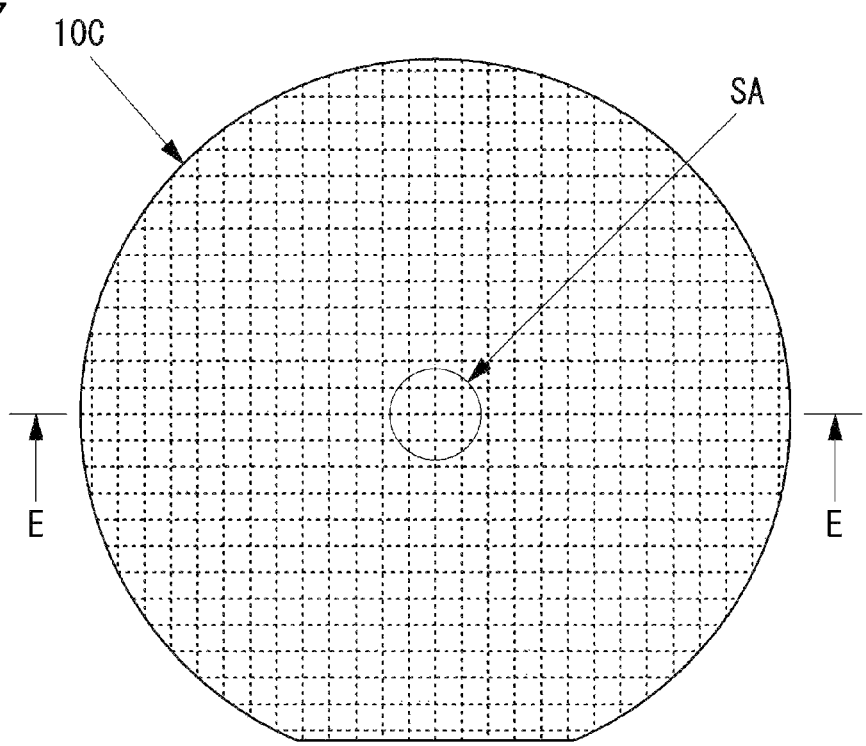
FIG. 7 is a plan view illustrating the state of formation of altered layers of the sample of Manufacturing Example, the figure being a plan view of a monocrystalline substrate the inside of the face of which is irradiated with a laser along lattice lines.
Figure 8:
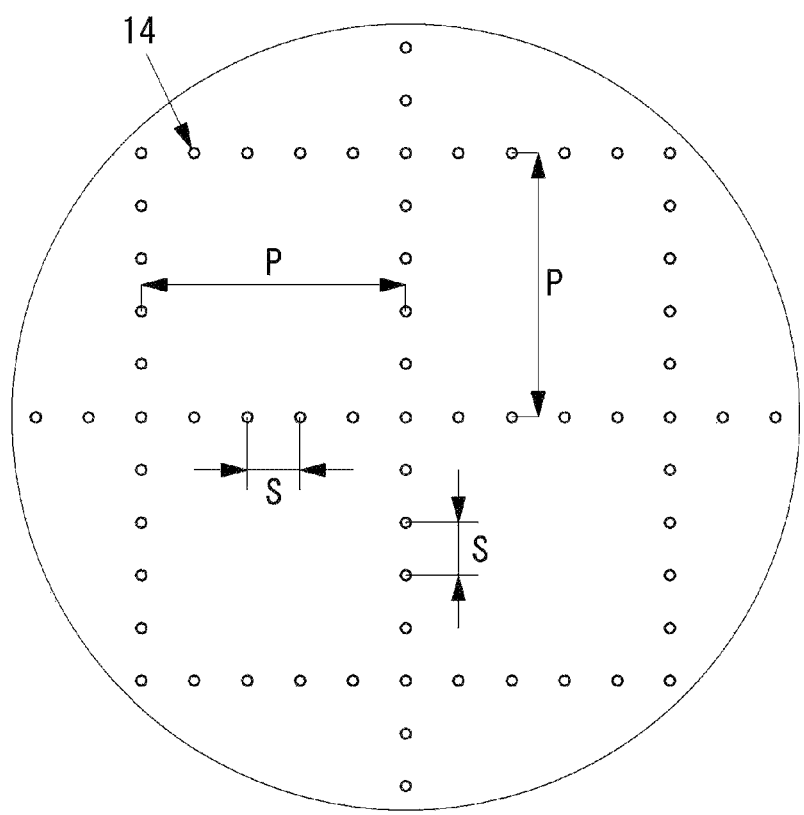
FIG. 8 is an enlarged view of an SA portion of FIG. 7 in Manufacturing Example.
Figure 9:
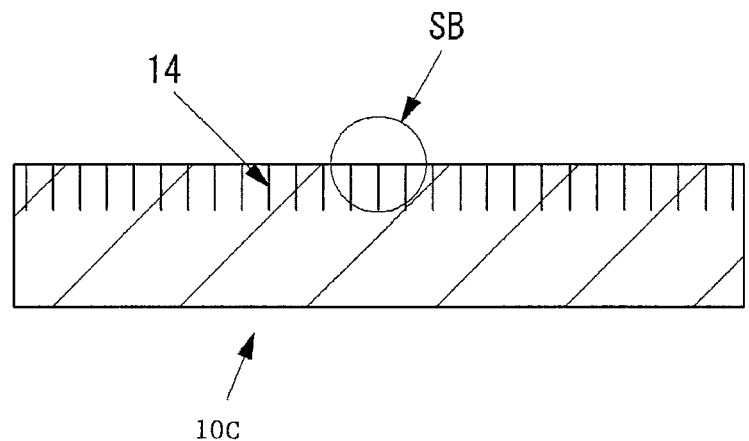
FIG. 9 is a sectional view of the monocrystalline substrate illustrated in FIG. 7 in Manufacturing Example when the monocrystalline substrate is cut along an E-E portion.
Figure 10:
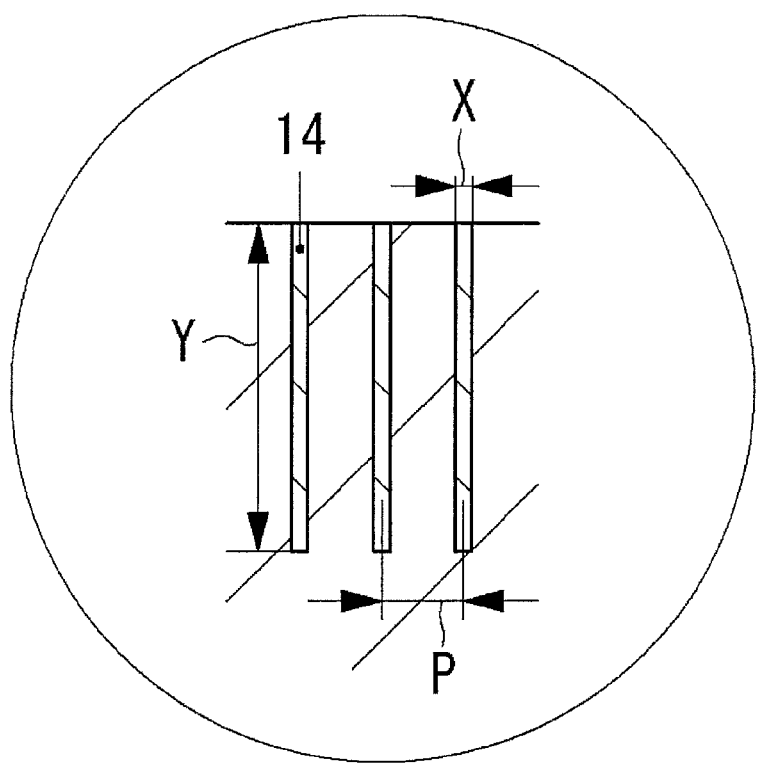
FIG. 10 is an enlarged view of an SB portion of FIG. 9.

<Laser Irradiation Conditions>
Laser wavelength: 1,045 nm
Pulse width: 500 fs
Repetition frequency: 100 kHz
Spot size: 1.6 μm to 3.5 μm
Laser power: 300 mW
Scanning speed of sample stage: 1,000 mm/s The irradiation with the laser LB was performed along lattice lines illustrated in dotted lines in FIG. 7 on the basis of the laser irradiation conditions described above to form the altered layers 14 in the face of the monocrystalline substrate 10A so that a processing pitch P between processing lines (that is, between the lattice lines) became 100 μm and an interval S between the altered layers on each processing line became 10 μm as illustrated in FIG. 8. Thus, a monocrystalline substrate 10C was obtained. It should be noted that the observation of a cut surface of the monocrystalline substrate 10C with an optical microscope confirmed that the altered layers 14 were each formed into a columnar shape so as to extend from a position having a depth of about 40 μm from the first face 12T to a side closer to the first face 12T. A time period required for the laser processing at that time was about 5 minutes. FIG. 9 illustrates a sectional view of the monocrystalline substrate 10C. Further, as illustrated in FIG. 10, each of the altered layers 14 of columnar shapes had an inner diameter X of 2 μm and a depth Y of 40 μm.

Subsequently, the monocrystalline substrate 10C having formed therein the altered layers 14 was subjected to wet etching by being immersed in an etching solution having a liquid temperature of 250° C. (containing phosphoric acid at a concentration of 85%) for 15 minutes. After that, the substrate was immersed in water for rinsing. Further, the substrate was immersed in isopropyl alcohol (IPA), followed by drying. Thus, the monocrystalline substrate 30A for a light-emitting element having the 4,050,000 vertical holes 34A formed in its face was obtained.

It should be noted that a time period required for the laser processing and any other treatment to be performed before or after the laser processing such as the vacuum adsorption fixing of the monocrystalline substrate 10A was about 5 minutes, and a time period required for the wet etching treatment and any other treatment involved therein such as the rinsing treatment was about 15 minutes. That is, a time period required for the formation of the vertical holes 34A in the monocrystalline substrate 10A was 20 minutes.

Figure 6:
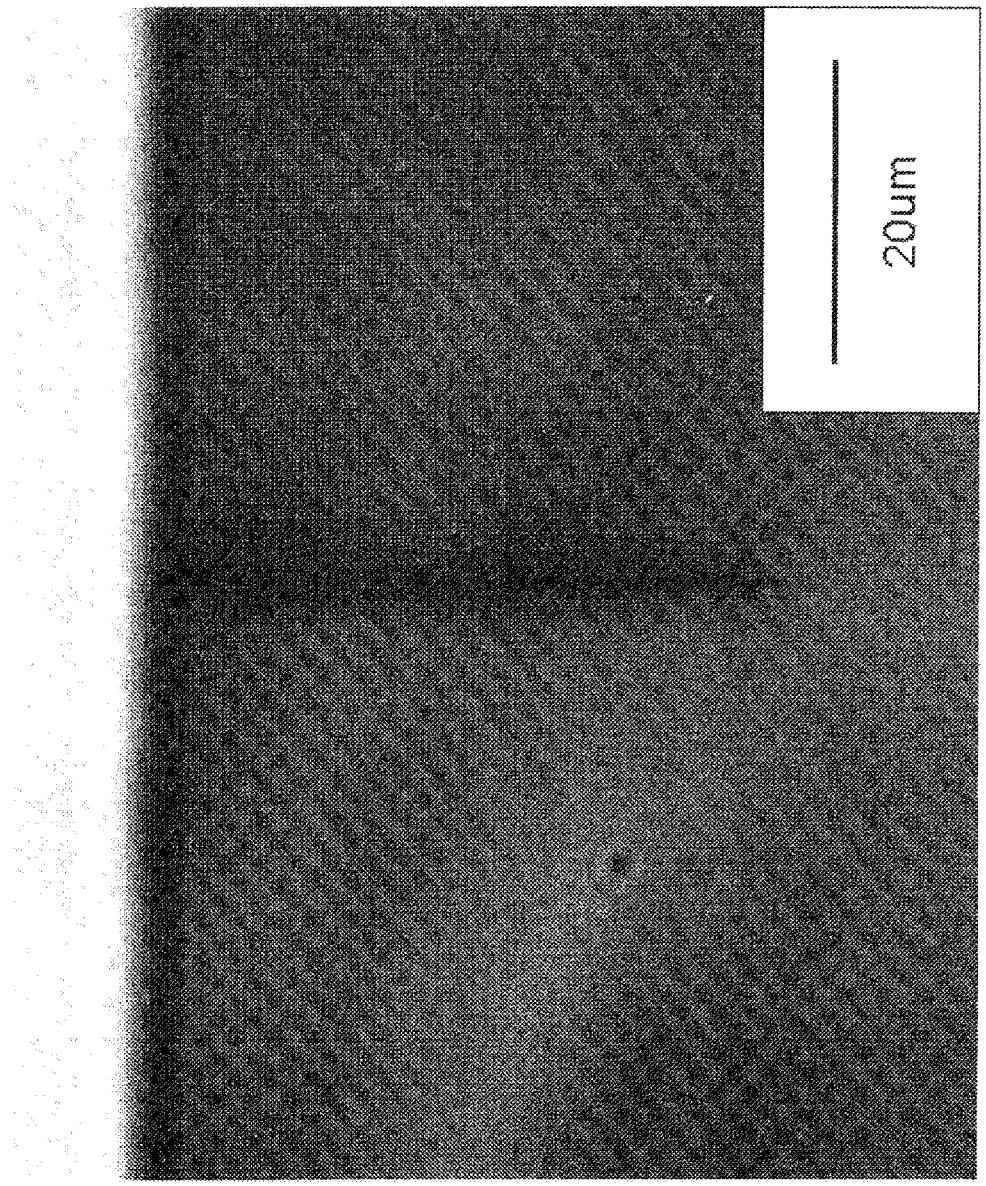
FIG. 6 is an optical micrograph of the sectional shape of a vertical hole of a sample of Manufacturing Example.

(Evaluation)
The sample formed in Manufacturing Example was cut so that a cutting line passed the center points of the openings 36T. After that, the section of the sample was observed with a scanning electron microscope and evaluated for the sectional shape, maximum inner diameter Xmax, depth Y, and ratio (Y/Xmax) of each of the vertical holes 34A. Table 1 shows the results. It should be noted that FIG. 6 shows an optical micrograph of the sectional shape of a vertical hole of the sample of Manufacturing Example for reference.

TABLE 1

| | | Manufacturing Example |
|---|---|---|
| Laser processing condition | Laser wavelength (nm) | 1,045 |
| | Pulse width (fs) | 500 |
| | Repetition frequency (kHz) | 100 |
| | Spot size (μm) | 1.6 to 3.5 |
| | Laser power (mW) | 300 |
| | Scanning speed of sample stage (mm/s) | 1,000 |
| Wet etching condition | Liquid temperature of etching solution (° C.) | 250 |
| | Immersion time in etching solution (minutes) | 15 |
| Time period required for vertical hole formation | | 20 minutes |
| Shape and size of vertical hole | Sectional shape | FIG. 5 |
| | Maximum inner diameter Xmax (μm) | 2 |
| | Depth Y (μm) | 40 |
| | Y/Xmax | 20 |

In, for example, an example disclosed in Patent Literature 2, the etching rate of dry etching is at most about 2.3 μm/hr. In addition, an etching rate when sapphire itself is etched under the same wet etching conditions as those of Manufacturing Example is about 9 μm/hr. In addition, a series of operations (such as film formation, exposure, and development) required for the formation and removal of an etching-resistant mask needed upon performance of the dry etching or the wet etching typically takes about 30 to 90 minutes, though the time period depends on facilities to be used and the like. Therefore, it can be said that when an attempt is made to manufacture a monocrystalline substrate for a light-emitting element having a vertical hole having the depth Y comparable to that of Manufacturing Example by utilizing any such etching method, the dry etching requires about 7 to 8 hours and the wet etching requires about 5 to 6 hours. That is, it was found that when a monocrystalline substrate for a light-emitting element having a vertical hole having the depth Y comparable to that of Manufacturing Example was manufactured by utilizing simple dry etching or simple wet etching, a much longer time period than that of Manufacturing Example was required.

(Vertical Hole Formation in Laser Etching)
An investigation was conducted on the basis of the laser irradiation conditions of Manufacturing Example for forming the vertical holes 34A each having the depth Y comparable to that of Manufacturing Example through laser etching in a spot manner. As a result, the following conditions were found. The feature of the laser irradiation conditions lies in that mainly the laser power was significantly increased as compared with that of the laser irradiation conditions of Manufacturing Example for enabling not the alteration of a sapphire material but the evaporation (ablation) thereof.

<Laser Irradiation Conditions>
Laser wavelength: 266 nm
Pulse width: 10 ns to 20 ns
Repetition frequency: 10 kHz
Spot size: 2 μm to 5 μm
Laser power: 1.3 W Here, in the laser irradiation conditions described above, a time period required for the formation of one vertical hole having the same depth as that of Manufacturing Example was about 3.0 msec. The foregoing showed that it took at least about 3 hours to scan the surface of a monocrystalline substrate with a laser to form the same number of vertical holes as that of the sample of Manufacturing Example. That is, it was found that when a monocrystalline substrate for a light-emitting element having a vertical hole having the depth Y comparable to that of Manufacturing Example was manufactured by utilizing simple laser etching, a much longer time period than that of Manufacturing Example was required.

It should be noted that the method involving forming the altered layers 14 through laser irradiation and etching the altered layers 14, and the monocrystalline substrate 30A for a light-emitting element formed by utilizing the method described above can be utilized in a method of manufacturing a light-emitting element other than the method of manufacturing a light-emitting element of the first embodiment and the method of manufacturing a light-emitting element of the second embodiment as well, and can be utilized in the manufacture of various elements using monocrystalline substrates except a light-emitting element as well.

The invention claimed is:

1. A method of manufacturing a light-emitting element, comprising at least:
   a light-emitting element layer-forming step of forming a light-emitting element layer on one face of a monocrystalline substrate for a light-emitting element provided with a vertical hole having an opening only in the one face;
   a polishing step of polishing another face of the monocrystalline substrate for a light-emitting element until a state where the vertical hole penetrates the monocrystalline substrate for a light-emitting element in a thickness direction thereof is established after performing at least the light-emitting element layer-forming step; and
   a conductive portion-forming step of filling a conductive material into the vertical hole from a side of the vertical hole closer to an opening in the another face after performing at least the polishing step to form a conductive portion that is continuous from a side closer to the light-emitting element layer to the opening in the another face.

2. A method of manufacturing a light-emitting element according to claim 1, wherein the monocrystalline substrate for a light-emitting element is formed at least through:
   an altered layer-forming step of irradiating a monocrystalline substrate with a laser from a side closer to one face of the monocrystalline substrate while focusing the laser in a vicinity of a surface of the one face to form an altered layer of a substantially columnar shape whose center line in an axial direction intersects the one face; and
   a vertical hole-forming step of bringing at least the one face into contact with an etching solution after performing at least the altered layer-forming step to selectively dissolve and remove the altered layer to form a vertical hole having an opening only in the one face.

3. A method of manufacturing a light-emitting element according to claim 2, wherein the irradiation with the laser is performed to satisfy irradiation conditions described in one selected from the following A and B
   <Irradiation conditions A>
   Laser wavelength: 200 nm to 350 nm
   Pulse width: Nanosecond order
   <Irradiation conditions B>
   Laser wavelength: 350 nm to 2,000 nm
   Pulse width: Femtosecond order to picosecond order.

4. A method of manufacturing a light-emitting element according to claim 3, wherein:
   an inner wall surface of the vertical hole is formed of an etching surface; and
   an inner diameter of the vertical hole with respect to a depth direction of the vertical hole reduces in a substantially linear function manner from a side closer to the opening in the one face to a side closer to the opening in the another face.

5. A method of manufacturing a light-emitting element according to claim 2, wherein:
   an inner wall surface of the vertical hole is formed of an etching surface; and
   an inner diameter of the vertical hole with respect to a depth direction of the vertical hole reduces in a substantially linear function manner from a side closer to the opening in the one face to a side closer to the opening in the another face.

6. A method of manufacturing a light-emitting element according to claim 1, wherein:
   an inner wall surface of the vertical hole is formed of an etching surface; and
   an inner diameter of the vertical hole with respect to a depth direction of the vertical hole reduces in a substantially linear function manner from a side closer to the opening in the one face to a side closer to the opening in the another face.

7. A method of manufacturing a light-emitting element by using a filmed monocrystalline substrate for a light-emitting element, which includes a monocrystalline substrate for a light-emitting element provided with a vertical hole having an opening only in one face thereof, and a film formed on the one face of the monocrystalline substrate for a light-emitting element and formed of one or more layers including at least a layer formed of a GaN-based material,
   the method comprising at least:
   a polishing step of polishing another face of the monocrystalline substrate for a light-emitting element until a state where the vertical hole penetrates the monocrystalline substrate for a light-emitting element in a thickness direction thereof is established; and
   a conductive portion-forming step of filling a conductive material into the vertical hole from a side of the vertical hole closer to an opening in the another face after performing at least the polishing step to form a conductive portion that is continuous from a side closer to the film to the opening in the another face.

* * * * *